United States Patent
Brewer et al.

[11] Patent Number: 6,114,673
[45] Date of Patent: Sep. 5, 2000

[54] HOUSING FOR OPTICAL INTEGRATED CIRCUITS

[75] Inventors: Tracy E. Brewer, Duluth; George F. DeVeau, Cumming; Daren Li, Marietta, all of Ga.

[73] Assignee: Lucent Technologies Inc., Murray Hill, N.J.

[21] Appl. No.: 09/321,412

[22] Filed: May 28, 1999

Related U.S. Application Data

[63] Continuation of application No. 08/994,266, Dec. 19, 1997, Pat. No. 5,994,679.

[51] Int. Cl.⁷ ........................................ H05B 3/06
[52] U.S. Cl. ........................ 219/530; 219/209
[58] Field of Search ........................ 219/209, 210, 219/385, 386, 520, 521, 524, 530, 531, 538, 540, 541, 542, 546, 547, 548, 552, 553; 174/65 R, 135, 163 R; 385/136, 137

[56] References Cited

U.S. PATENT DOCUMENTS

| | | | |
|---|---|---|---|
| Re. 34,179 | 2/1993 | Eccleston | 307/310 |
| 3,694,626 | 9/1972 | Harden, Jr. | 219/541 |
| 3,816,702 | 6/1974 | Green | 219/209 |
| 3,883,715 | 5/1975 | Gebo | 219/210 |
| 4,216,371 | 8/1980 | Marotel | 219/210 |
| 4,251,714 | 2/1981 | Zobele | 219/275 |
| 4,307,289 | 12/1981 | Thomas et al. | 219/521 |
| 4,369,355 | 1/1983 | Helixon | 219/521 |
| 4,388,521 | 6/1983 | Thomas et al. | 219/521 |
| 4,414,576 | 11/1983 | Randmae | 358/229 |
| 4,460,820 | 7/1984 | Matsumoto et al. | 219/385 |
| 4,672,180 | 6/1987 | Kusunoki et al. | 219/494 |
| 4,684,783 | 8/1987 | Gore | 219/210 |
| 4,833,681 | 5/1989 | Akiyama et al. | |
| 4,873,424 | 10/1989 | Ryder et al. | 219/521 |
| 4,968,121 | 11/1990 | Bruesselbach et al. | 350/354 |
| 4,978,914 | 12/1990 | Akimoto et al. | 219/209 |
| 5,122,636 | 6/1992 | Jung | 219/209 |
| 5,132,874 | 7/1992 | Chandler et al. | 219/210 |
| 5,136,671 | 8/1992 | Dragone | 385/46 |
| 5,235,159 | 8/1993 | Kornrumpf et al. | 219/486 |
| 5,559,915 | 9/1996 | DeVeau | 385/49 |
| 5,585,024 | 12/1996 | Kosugi | 219/209 |
| 5,587,096 | 12/1996 | Huvard et al. | 219/521 |
| 5,862,040 | 1/1999 | Adnan | 219/209 |
| 5,917,272 | 6/1999 | Clark et al. | 219/210 |
| 5,919,383 | 7/1999 | Beguin et al. | 219/209 |

*Primary Examiner*—Teresa Walberg
*Assistant Examiner*—Fadi H. Dahbour

[57] ABSTRACT

A preferred embodiment of the housing incorporates an enclosure defining an interior cavity. A thermal bed is supported within the cavity and is configured to retain an optical integrated circuit within the cavity. First and second fiber members also are provided that each include a circuit end for engaging and optically communicating with the optical integrated circuit, and a coupling end for engaging a coupling. Preferably, the couplings are mounted to the enclosure so that an external fiber member can engage a coupling and optically communicate with the optical integrated circuit.

24 Claims, 2 Drawing Sheets

HOUSING FOR OPTICAL INTEGRATED CIRCUITS

CROSS-REFERENCE TO RELATED APPLICATIONS

This appln is a cont of U.S. patent application Ser. Nos. 08/994,266, filed on Dec. 19, 1997, now U.S. Pat. No. 5,994,679 and (Cammons 5-23/60103-1480), filed on May 28, 1999.

BACKGROUND OF THE INVENTION

1. Field of the Invention

This invention relates to optical integrated circuits and, more particularly, to a thermal housing that reduces stresses to its internally housed optical integrated circuit components by minimizing external fiber handling requirements of the housing.

2. Description of the Related Art

Communication systems utilizing optical signals encounter problems that are unique to light wave signal manipulation. These problems generally are not present in communication systems utilizing lower frequency signals, such as those systems which include conductive wires for the transmission of the lower frequency signals. For example, optical switching, multiplexing, and demultiplexing are all operations that present problems. Heretofore, such operations typically have required numerous discrete optical components and, as a result, the systems incorporating these components suffer from increased bulkiness and reduced reliability. As a consequence, much effort has been directed at reducing the number of system components by combining their operations on single, monolithic chip which generally comprises a thin film, compact planar optical circuit.

One example of such a monolithic device is a dense wave division multiplexer (DWDM) of the type shown, for example, in U.S. Pat. No. 5,136,671, issued to Dragone, the disclosure of which is herein incorporated by reference. Such a device is useful where a large number of transmission channels must be crowded into a narrow bandwidth window. Such narrow windows can result, for example, from the use of erbium doped optical amplifiers, which are widely used today, but which can severely limit the usable bandwidth. In order to accommodate many channels in the narrow window, the channels must be closely spaced in wavelength, such as, for example, successive wavelengths differing by 0.8 nm or 1.6 nm.

By use of OASIC (optical application specific integrated circuits) technology, thin film planar optical circuits can be formed to produce such a DWDM as discussed, on a single wafer or chip. Such a chip generally comprises a thin silicon wafer upon which a low refractive index silica glass lower cladding is deposited. A high index core layer is then deposited, patterned, and etched to form the optical waveguides, and then an upper cladding is deposited. Wafers for a variety of functions can be produced using the OASIC technology; however, the remainder of the discussion will be directed to the DWDM in the interest of simplicity and consistency. It should be understood that these other types of integrated circuits are by no means intended to be excluded.

One of the problems arising from the use of some OASIC devices, particularly the arrayed waveguide gratings in a DWDM, is their sensitivity to temperature changes, and to physical stresses which impair their reliability. For example, in the DWDM, because the operating wavelengths of the several individual channels differ by such a small degree, any expansion, contraction or bending due to temperature fluctuations, i.e. temperature fluctuations of less than 1° C., can degrade the optical performance and, in extreme cases, can cause circuit failure.

It has been found that degradation and failure generally can be prevented and reliability of the circuit ensured if the temperature of the device is maintained at a predetermined temperature in a range of 75° C. to 90° C. This maintenance temperature, specific to the individual circuit, must be controlled to within a few degrees Celsius even though the ambient temperature may vary from, for example, 0° C. to 70° C. Thus, some sort of protective housing must be provided for the wafer, i.e. circuit.

Maintaining various types of electronic devices at an even temperature by housing them in sealed containers is well known in the prior art (U.S. Pat. No. 4,968,121 issued to Brusselbach et al., for instance). In any such housing for maintaining a substantially constant temperature in at least a portion thereof, each component within the housing, as well as the housing itself, is subject to deleterious temperature effects during operation. Thus, expansion or contraction of the housing itself due to temperature changes can affect at least some of the components within the housing, to the detriment of the overall operation of the device.

Mechanical stresses also can effect at least some of the components arranged within a housing, with the mechanical stresses typically being associated with the handling of fibers which interconnect the internally housed components with external devices. For example, a typical housing for a DWDM circuit cooperates with a buffered fiber which passes into the housing for carrying input optical signals to the DWDM. The output signals of the DWDM circuit exit the housing, such as through a ribbon fiber, with each fiber of the ribbon fiber including a jack plug at its terminated end that is arranged external to the housing. So configured, improper handling of the buffered fiber or of the ribbon fiber can transmit mechanical stresses to the internally housed components to which the fibers are connected. Additionally, improper bending of the fibers caused by external handling or improper interior fiber storage, among others, can result in increased signal loss and/or fiber stress and also can result in fiber to waveguide joint instability, and possibly failure.

Therefore, there is a need to provide thermal housings that address these and other shortcomings of the prior art.

BRIEF SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

The present invention generally is directed to a housing for an optical integrated circuit, such as a DWDM, that is structured to maintain, during operation, the temperature of a circuit and surrounding elements within a narrow temperature range, regardless of ambient temperature, for extended periods. In a preferred embodiment, the housing incorporates an enclosure defining an interior cavity. A thermal bed is supported within the cavity and is configured to retain an optical integrated circuit within the cavity. First and second fiber members also are provided that each include a circuit end for engaging and optically communicating with the optical integrated circuit, and a coupling end for engaging a coupling. Preferably, couplings are mounted to the enclosure and each incorporates an interior fiber-receiving receptacle oriented within the cavity and an exterior fiber-receiving receptacle oriented about an exterior of the enclosure. Each of the exterior fiber-receiving receptacles are adapted to engage an external fiber member so that the external fiber member can optically communicate with the optical integrated circuit.

In accordance with an aspect of the present invention, a preferred embodiment of the housing includes a fiber clamp mounted within the cavity between the optical integrated circuit and one of the side walls of the enclosure. The fiber clamp has a fiber-receiving slot formed therethrough for receiving a looped end of a first fiber member so that a minimum bend radius of the first fiber is maintained. Preferably, the fiber-receiving slot is arranged such that the first fiber member extends from the optical integrated circuit through the fiber-receiving slot and toward a side wall of the enclosure, is redirected back through the fiber-receiving slot to form the looped end of the first fiber member, and then is redirected to the interior fiber-receiving receptacle of a coupling. In some embodiments, the optical integrated circuit is oriented in a first plane and the fiber clamp retains the first fiber member in the first plane.

In accordance with another aspect of the present invention, a preferred embodiment of the housing includes a ribbon clamp mounted within the cavity, with the ribbon clamp having a ribbon-receiving slot formed therethrough for receiving a ribbon fiber. The ribbon fiber communicates with the optical integrated circuit and preferably extends from the optical integrated circuit through the ribbon-receiving slot and toward a side wall of the enclosure. The ribbon fiber then is directed to the interior fiber-receiving receptacle of a coupling.

In accordance with another aspect of the present invention, a preferred embodiment incorporates an enclosure defining a cavity and an optical integrated circuit retained within the cavity. A thermal bed member is mounted within the cavity and includes a slot which is adapted to retain the optical integrated circuit. Thermally conductive material, such as silver-filled silicone grease, for example, is disposed within the slot between the thermal bed and the optical integrated circuit. A heater is provided for heating the optical integrated circuit, when necessary, in order to maintain the temperature of the circuit within a predetermined range. Additionally, first and second fiber members are disposed within the cavity, with the first fiber member having a first end optically communicating with the optical integrated circuit and a second end adapted to optically communicate with a third fiber member, and the second fiber member having a first end optically communicating with the optical integrated circuit and a second end adapted to optically communicate with a fourth fiber member. Preferably, the third and fourth fiber members are arranged exterior of the enclosure.

A method aspect of the present invention preferably includes the steps of (1) housing an optical integrated circuit within an enclosure, and; (2) providing first and second fiber members within the enclosure, each of the first and second fiber members having a first end optically communicating with the optical integrated circuit and a second end mounted adjacent the enclosure that is adapted to optically communicate with an external fiber member. In some embodiments, the second ends of the first and second fiber members are mounted within the enclosure.

The numerous features and advantages of the present invention will be more readily apparent from the following detailed description, read in conjunction with the accompanying drawings.

BRIEF DESCRIPTION OF THE SEVERAL VIEWS OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
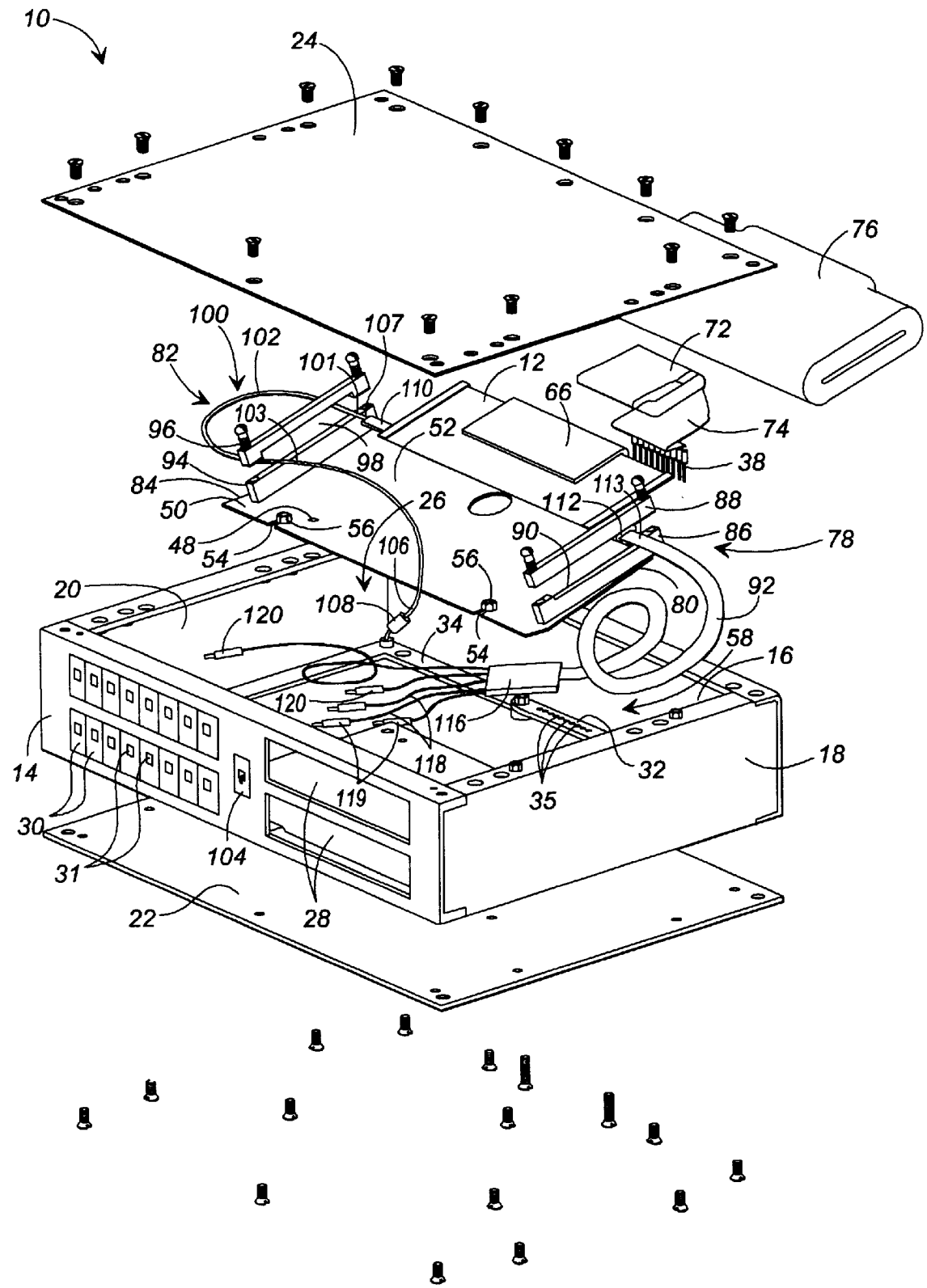
FIG. 1 is a partially exploded, perspective, front view of a preferred embodiment of the housing of the present invention.
Figure 2:
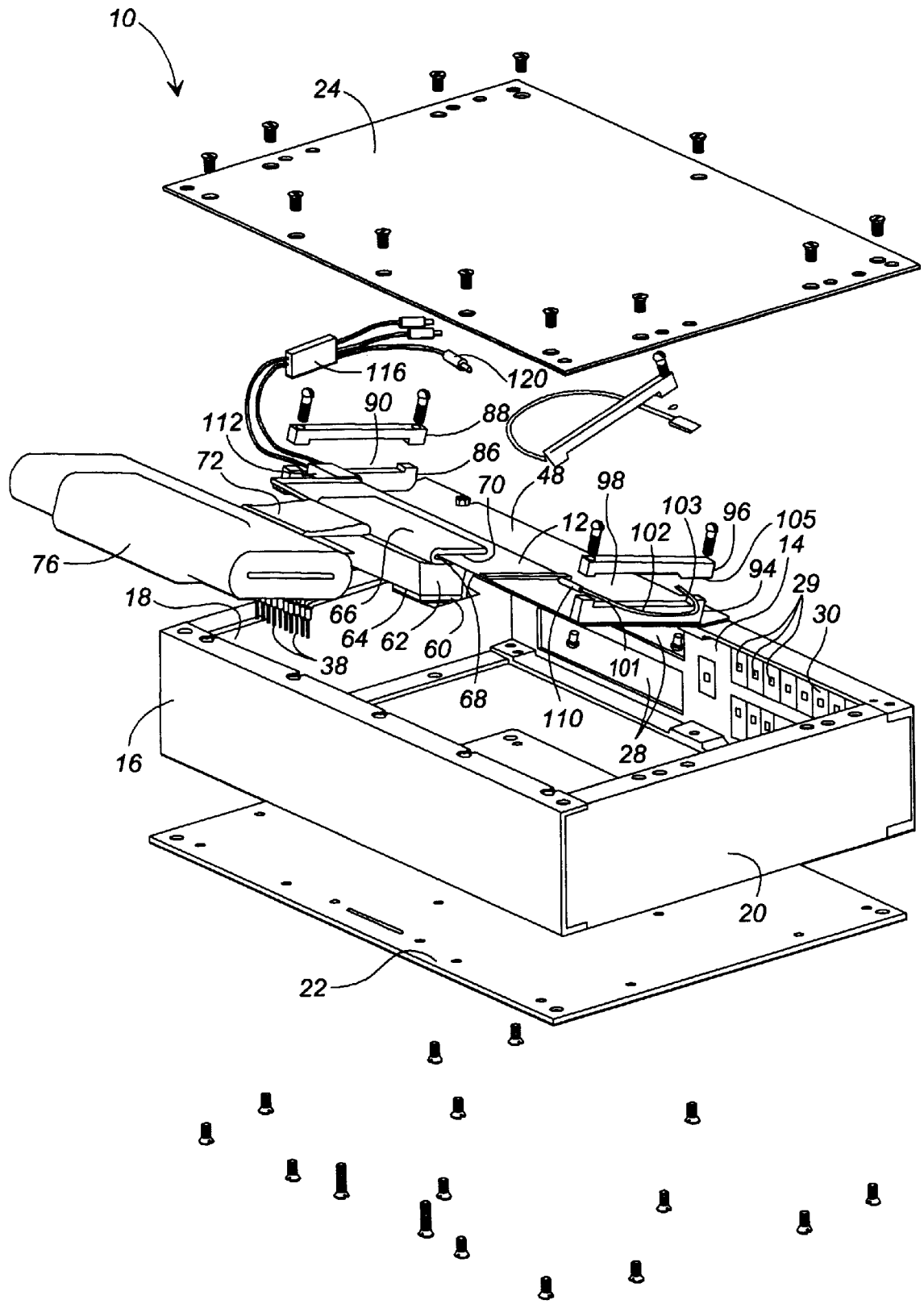
FIG. 2 is a partially exploded, perspective, rear view of the embodiment depicted in FIG. 1.

Reference will now be made in detail to the description of the invention as illustrated in the drawings, wherein like reference numbers indicate like parts throughout the several views. As shown in FIGS. 1 and 2, a preferred embodiment of the housing 10 of the present invention is utilized to house an optical integrated circuit (OIC), such as a DWDM 12, for example. The remainder of this discussion will refer to embodiments of the invention incorporating DWDM circuits; however, it should be understood that other types of integrated circuits are by no means intended to be excluded.

Housing 10 includes a front wall 14, a back wall 16, and side walls 18 and 20 that cooperate with a bottom wall 22 and top wall 24 to define an interior cavity 26, which is sized and shaped for the placement of various components, described in detail hereinafter, therein. Front wall 14 preferably incorporates one or more openings 28, which provide access to the interior cavity 26, and which are provided for mounting one or more couplings 30 therein. The couplings 30 provide optical interfaces between interior fiber-receiving receptacles 29 and the exterior fiber-receiving receptacles 31 of the couplings 30, and are adapted for optically interconnecting internal components of the housing 10, described hereinafter, and external fiber members oriented exterior of the housing.

Preferably, bottom wall 22 is formed of a nonconductive material, such as a glass/epoxy composite, that allows the housing 10 to be mounted on an active printed wire board (PWB) without interfering with electrical traces. A terminal strip 32, preferably arranged along a bottom flange 34 of back wall 16, incorporates one or more apertures 35 which cooperate with apertures (not shown) formed through bottom wall 22. The apertures are adapted for receiving pins 38 which, when inserted into the apertures, preferably extend outwardly from the bottom wall 22 of the housing 10 for engaging a PWB (not shown). So configured, the pins 38 provide an interface between an external temperature controller (not shown), such as a circuit with a microprocessor controlled thermal management system, for instance, that is preprogrammed to maintain a predetermined temperature of the internal components of the housing 10.

Mounting of DWDM 12 within the housing 10 is facilitated by a mounting platform 48, preferably formed from a single piece of INVAR (such as Invar 36 alloy, manufactured by Carpenter Technology Corp. of Reading, Pa.), which has approximately the same thermal coefficient of expansion as silicon (2 to 4 ppm/°C.) so that during temperature cycling (0° C. to 65° C. operational, and −40° C. to 85° C. reliability test) of the housing and its internal components, stress applied to the DWDM 12 or its various interface joints, described hereinafter, is reduced. The mounting platform 48 generally is configured in a rectangular shape, with an extended lower portion 50 which is inclined relative to the mounting portion 52 of the mounting platform 48. Preferably, mounting platform 48 includes preformed recesses 54 along lower portion 50 that serve as attachment points for mechanical fasteners 56 which affix the mounting platform 48 to the bottom wall 22. Thus, as the lower portion 50 of the mounting platform 48 is affixed to the bottom wall 22, the mounting portion 52 extends upwardly and into the cavity 26, thereby providing a space or storage area 58 below the mounting portion 52 that is suited for the placement of various components.

Tabs 60 extend from the mounting platform 48 and are configured for mounting a polyimide spun fiber insulating block 62 using high-temperature, double-sticky foam tape 64, which is disposed between the tabs 60 and the insulating block 62, for thermally decoupling the mounting platform 48 from a thermal bed 66. The thermal bed 66, which preferably is formed as a U-shaped member of suitable thermally conductive material, such as aluminum, suspends the DWDM 12. The thermal bed 66 defines a slot 68, which contains a thermally conductive grease 70, such as a silver-filled silicone grease, among others. Preferably, the grease should be selected so that it maintains its properties over broad environmental and temperature ranges, and should be resistant to moisture, humidity, ozone, radiation, and many chemicals, such a grease is commercially available as NOR-SIL 56840-EC, produced by Norlabs Company. While thermal bed 66 is depicted in FIGS. 1 and 2 as U-shaped, other shapes and/or configurations can be utilized as long as the thermal bed is capable of substantially covering DWDM 12, and is capable of retaining the grease 70 within the slot 68.

A flexible heater/RTD circuit 72 preferably is mounted below the mounting portion 52 of the mounting platform 48, and is connected to pins 38 by a series of leads 74. A woven polyimide blanket 76 is placed around the entire DWDM 12, thermal bed 66, and heater circuit 72 to maintain a uniform temperature of the DWDM at minimum power requirements.

Preferably, a ribbon clamp 78 is provided along an end 80 of the mounting platform 48, and a fiber clamp 82 along its other end 84. Ribbon clamp 78 includes a lower clamp member 86 affixed to mounting platform 48 that cooperates with an upper clamp member 88, with a ribbon-receiving slot or recess 90 formed between the clamp members that is sized for receiving a fiber member, such as ribbon fiber 92. Lower clamp member 86 cooperates with the upper clamp member 88 and is movable between an open position and a clamped position to secure the position of the ribbon fiber 92 relative to the DWDM 12 and, in particular, preferably maintains the ribbon fiber 92 in the same plane as the DWDM 12. Likewise, the fiber clamp 82 includes a lower clamp member 94 affixed to the mounting platform 48 that cooperates with an upper clamp member 96 and is movable between an open position and a clamped position, with a fiber-receiving slot or recess 98 formed therebetween. The fiber-receiving recess 98 is sized to receive a looped end 100 of a fiber member, i.e. optical fiber 102, such that the fiber-receiving recess 98 maintains a required minimum bend radius of the fiber 102. This is achieved by allowing a portion 101 of fiber 102 to move freely within the recess 98, while firmly securing a portion 103 of the fiber 102 between a clamping surface 105 of the upper clamp 96 and the lower clamp 94.

A fiber coupling 104 is mounted within an opening 28 of front wall 14 and is adapted to receive a terminated or coupling end 106 of the fiber 102. Typically, the fiber 102 is terminated with a connector 108 which is configured to engage the coupling 104. From the coupling 104, the fiber 102 extends into the cavity 26 and is directed through the fiber-receiving recess 98 of the fiber clamp 82 toward side wall 20. The fiber 102 then turns through approximately 180° and reenters fiber-receiving recess 98, thereby forming the looped end 100 which conforms to the minimum bend radius requirements of the fiber. Fiber 102 then terminates at its circuit end 107 with a connector 110, which connects the fiber 102 to the DWDM 12.

A connector 112 also is attached to DWDM 12, and is provided for interconnecting ribbon fiber 92, at its circuit end 113 to the DWDM. From the connector 112, ribbon fiber 92 extends through the ribbon clamp 78, which preferably retains the ribbon fiber in the same plane as that of the DWDM 12 while allowing the portion of the ribbon fiber extending from the ribbon clamp to bend from the plane of the DWDM, thereby allowing excess ribbon fiber to be organized and arranged within the cavity 26 without violating the minimum bend radius requirements of the fibers of the ribbon fiber. Downstream of the ribbon clamp 78, a ribbon-to-fiber transition 116 is provided for separating the multi-fiber ribbon fiber 92 into individual fibers 118. Each of the fibers 118 are then terminated at their coupling ends 119 in an optical connector 120, such as an LC connector, among others, that are received within the couplings 30.

Since the DWDM 12 floats in the thermal conducting grease 70, the DWDM is not subject to stresses due to thermal expansion of the thermal bed 66. Potential stresses are also reduced because the mounting platform 48 preferably is formed of INVAR, which possesses the same thermal coefficient of expansion as that of the DWDM. Additionally, external mechanical stresses are significantly reduced and/or eliminated by the housing 10 because fiber handling by end users is eliminated by utilizing the couplings 30 and 104 mounted to the front wall 14 of the housing 10. Furthermore, other mechanical stresses are reduced and/or eliminated by the ribbon clamp 78 and fiber clamp 82, which inhibit the ability of the ribbon fiber 92 and fiber 102, respectively, to transfer tensile and torsional loads to the DWDM 12.

The housing of the invention constitutes a means of protecting various types of printed circuits and the like from the deleterious consequences of temperature changes, by insuring a stable temperature environment for such circuits. Various modifications or adaptations of the principles of the invention to specific specialized uses may be made which, while perhaps involving different physical configurations, do not depart from those principles as disclosed in the foregoing.

The foregoing description has been presented for purposes of illustration and description. It is not intended to be exhaustive or to limit the invention to the precise forms disclosed. Obvious modifications or variations are possible in light of the above teachings. The embodiment discussed, however, was chosen and described to provide the best illustration of the principles of the invention and its practical application to thereby enable one of ordinary skill in the art to utilize the invention in various embodiments and with various modifications as are suited to the particular use contemplated. In particular, the housing of the present invention constitutes a means of protecting various types of circuits and other components. Various modifications or adaptations of the principles of the invention to specific specialized uses may be made which, while perhaps involving different physical configurations, do not depart from those principles as disclosed in the foregoing. All such modifications and variations, are within the scope of the invention as determined by the appended claims when interpreted in accordance with the breadth to which they are fairly and legally entitled.

What is claimed is:

1. A housing for an optical integrated circuit comprising:

an enclosure having an opening formed therein, said enclosure defining an interior cavity, said opening communicating with said cavity;

a thermal bed supported within said cavity and thermally insulated from said enclosure, said thermal bed configured to retain the optical integrated circuit within said cavity, said thermal bed defining a slot such that said slot receives the optical integrated circuit;

a thermally conductive grease retained within said slot;

a heater arranged within said cavity, said heater thermally communicating with said thermal bed;

a first fiber member having a coupling end and a circuit end, said circuit end of said first fiber member engaging and optically communicating with the optical integrated circuit;

a second fiber member having a coupling end and a circuit end, said circuit end of said second fiber member engaging and optically communicating with the optical integrated circuit;

a first coupling having an interior fiber-receiving receptacle and an exterior fiber-receiving receptacle, said first coupling mounted to said enclosure within said opening such that said exterior fiber-receiving receptacle of said first coupling is oriented about an exterior of said enclosure, said interior fiber-receiving receptacle of said first coupling adapted to engage said coupling end of said first fiber member, said exterior fiber-receiving receptacle of said first coupling adapted to engage a third fiber member such that said first fiber member optically communicates with the third fiber member, and;

a second coupling having a interior fiber-receiving receptacle and an exterior fiber-receiving receptacle, said second coupling mounted to said enclosure within said opening such that said exterior fiber-receiving receptacle of said second coupling is oriented about said exterior of said enclosure, said interior fiber-receiving receptacle of said second coupling adapted to engage said coupling end of said second fiber member, said exterior fiber-receiving receptacle of said second coupling adapted to engage a fourth fiber member such that said second fiber member optically communicates with the fourth fiber member.

2. The housing of claim 1, wherein said housing has a mounting platform configured to securely retain said thermal bed within said cavity, said mounting platform extending upwardly from said base member and into said cavity such that a storage area is formed between said mounting platform and said base member, said heater being arranged at least partially within said storage area.

3. The housing of claim 2, wherein said mounting platform is formed of an iron-nickel alloy.

4. The housing of claim 1, wherein said enclosure comprises:

a base member formed of a nonconductive material;

side walls extending upwardly from said base member, at least one of said side walls having said opening formed therethrough;

a cap member spaced from said base member and engaging said side walls such that said base member, said side walls and said cap member define said cavity.

5. The housing of claim 1, wherein said first fiber member is a buffered optical fiber and said enclosure has a fiber clamp mounted within said cavity between the optical integrated circuit and one of said side walls, said fiber clamp having a fiber-receiving slot formed therethrough, said fiber-receiving slot being adapted to receive a looped end of said first fiber member and maintain a minimum bend radius thereof, said fiber-receiving slot arranged such that said first fiber member extends from the optical integrated circuit through said fiber-receiving slot toward said one of said side walls, is redirected through said fiber-receiving slot to form said looped end of said first fiber member, and then is redirected to said interior fiber-receiving receptacle of said first coupling.

6. The housing of claim 4, wherein said second fiber member is a ribbon fiber, and said enclosure has a ribbon clamp mounted within said cavity between the optical integrated circuit and another of said side walls, said ribbon clamp having a ribbon-receiving slot formed therethrough, said ribbon-receiving slot being adapted to receive said ribbon fiber and being arranged such that said ribbon fiber extends from the optical integrated circuit through said ribbon-receiving slot toward said another of said side walls and then is directed to said interior fiber-receiving receptacle of said second coupling.

7. The housing of claim 6, wherein the optical integrated circuit is oriented in a first plane, and said ribbon clamp retains said circuit end of said ribbon fiber in the first plane.

8. The housing of claim 5, wherein the optical integrated circuit is oriented in a first plane, and said fiber clamp retains said first fiber member in the first plane.

9. The housing of claim 1, further comprising means for clamping a looped end of the first fiber member.

10. The housing of claim 1, further comprising means for clamping the second fiber member.

11. A housing with optical integrated circuit comprising:

an enclosure defining a cavity;

a thermal bed member mounted within said cavity and thermally insulated from said enclosure, said thermal bed member configured as a substantially U-shaped member formed of thermally conductive material and forming a slot between extended portions of said U-shaped member;

an optical integrated circuit retained within said slot;

thermally conductive material disposed within said slot between said U-shaped member and said optical integrated circuit;

a heater engaging said thermal bed and adapted to heat optical integrated circuit;

a first fiber member disposed within said cavity, said first fiber member having a first end optically communicating with said optical integrated circuit and a second end adapted to optically communicate with a third fiber member, the third fiber member being arranged exterior of said enclosure, and;

a second fiber member disposed within said cavity, said second fiber member having a first end optically communicating with said optical integrated circuit and a second end adapted to optically communicate with a fourth fiber member, the fourth fiber member being arranged exterior of said enclosure.

12. The housing of claim 11, wherein said first fiber member is a buffered optical fiber and said enclosure has a fiber clamp mounted within said cavity between said optical integrated circuit and said enclosure, said fiber clamp having a fiber-receiving slot formed therethrough, said fiber-receiving slot being adapted to receive a looped end of said first fiber member and maintain a minimum bend radius thereof, said fiber-receiving slot arranged such that said first fiber member extends from said optical integrated circuit through said fiber-receiving slot toward said enclosure, is redirected through said fiber-receiving slot to form said looped end of said first fiber member.

13. The housing of claim 12, wherein said fiber-receiving slot is formed between upper and lower clamp members of said fiber clamp, said lower clamp being affixed adjacent said optical integrated circuit, said upper clamp member being movable relative said lower clamp member between an open position and a clamped position such that, in said clamped position, said fiber clamp securely retains said first fiber member within said fiber-receiving slot.

14. The housing of claim 11, wherein said second fiber member is a ribbon fiber, and said enclosure has a ribbon clamp mounted within said cavity between the optical integrated circuit and said enclosure, said ribbon clamp having a ribbon-receiving slot formed therethrough, said ribbon-receiving slot being adapted to receive said ribbon fiber and being arranged such that said ribbon fiber extends from said optical integrated circuit through said ribbon-receiving slot toward said enclosure.

15. The housing of claim 4, wherein said ribbon fiber extends from said optical integrated circuit through said ribbon-receiving slot toward said enclosure and engages a ribbon-to-fiber transition member, said ribbon-to-fiber transition member being adapted to separate said ribbon fiber into a plurality of fibers, each of said fibers terminating in an optical connector.

16. The housing of claim 15, wherein each of said optical connectors is an LC connector.

17. The housing of claim 11, wherein said thermally conductive material comprises silver-filled silicone grease.

18. A method for reducing mechanical stresses in an optical integrated circuit comprising the steps of:
    housing the optical integrated circuit within an enclosure, the enclosure having side walls;
    providing first and second fiber members within the enclosure, each of the first and second fiber members having a first end optically communicating with the optical integrated circuit and a second end securely mounted adjacent the enclosure and adapted to optically communicate with an external fiber member; and
    clamping a looped end of the first fiber member such that said first fiber member extends from the optical integrated circuit toward one of said side walls and then is redirected to optically communicate with one of the external fiber members.

19. The method of claim 18, wherein the first fiber member is a buffered optical fiber and the second fiber member is a ribbon fiber, and further comprising the step of:
    clamping the ribbon fiber such that the ribbon fiber extends from the optical integrated circuit toward one of said side walls and then is redirected to optically communicate with another one of the external fiber members.

20. A housing for an optical integrated circuit comprising:
    an enclosure having an opening formed therein, said enclosure defining an interior cavity, said opening communicating with said cavity;
    a thermal bed supported within said cavity and thermally insulated from said enclosure, said thermal bed configured to retain the optical integrated circuit within said cavity;
    a heater arranged within said cavity, said heater thermally communicating with said thermal bed;
    a buffered optical fiber having a coupling end and a circuit end, said circuit end of said buffered optical fiber engaging and optically communicating with the optical integrated circuit;
    a second fiber member having a coupling end and a circuit end, said circuit end of said second fiber member engaging and optically communicating with the optical integrated circuit;
    a first coupling having an interior fiber-receiving receptacle and an exterior fiber-receiving receptacle, said first coupling mounted to said enclosure within said opening such that said exterior fiber-receiving receptacle of said first coupling is oriented about an exterior of said enclosure, said interior fiber-receiving receptacle of said first coupling adapted to engage said coupling end of said buffered optical fiber, said exterior fiber-receiving receptacle of said first coupling adapted to engage a third fiber member such that said buffered optical fiber optically communicates with the third fiber member;
    a second coupling having a interior fiber-receiving receptacle and an exterior fiber-receiving receptacle, said second coupling mounted to said enclosure within said opening such that said exterior fiber-receiving receptacle of said second coupling is oriented about said exterior of said enclosure, said interior fiber-receiving receptacle of said second coupling adapted to engage said coupling end of said second fiber member, said exterior fiber-receiving receptacle of said second coupling adapted to engage a fourth fiber member such that said second fiber member optically communicates with the fourth fiber member, and;
    a fiber clamp mounted within said cavity between the optical integrated circuit and one of said side walls, said fiber clamp having a fiber-receiving slot formed therethrough, said fiber-receiving slot being adapted to receive a looped end of said buffered optical fiber and maintain a minimum bend radius thereof, said fiber-receiving slot arranged such that said buffered optical fiber extends from the optical integrated circuit through said fiber-receiving slot toward said one of said side walls, is redirected through said fiber-receiving slot to form said looped end of said buffered optical fiber, and then is redirected to said interior fiber-receiving receptacle of said first coupling.

21. The housing of claim 20, wherein said second fiber member is a ribbon fiber, and said enclosure has a ribbon clamp mounted within said cavity between the optical integrated circuit and another of said side walls, said ribbon clamp having a ribbon-receiving slot formed therethrough, said ribbon-receiving slot being adapted to receive said ribbon fiber and being arranged such that said ribbon fiber extends from the optical integrated circuit through said ribbon-receiving slot toward said another of said side walls and then is directed to said interior fiber-receiving receptacle of said second coupling.

22. The housing of claim 20, wherein the optical integrated circuit is oriented in a first plane, and said ribbon clamp retains said circuit end of said ribbon fiber in the first plane.

23. The housing of claim 20, wherein the optical integrated circuit is oriented in a first plane, and said fiber clamp retains said buffered optical fiber in the first plane.

24. A housing for an optical integrated circuit comprising:

an enclosure having an opening formed therein, said enclosure defining an interior cavity, said opening communicating with said cavity;

a thermal bed supported within said cavity and thermally insulated from said enclosure, said thermal bed configured to retain the optical integrated circuit within said cavity;

a heater arranged within said cavity, said heater thermally communicating with said thermal bed;

a first fiber member having a coupling end and a circuit end, said circuit end of said first fiber member engaging and optically communicating with the optical integrated circuit;

a ribbon fiber, having a coupling end and a circuit end, said circuit end of said ribbon fiber engaging and optically communicating with the optical integrated circuit;

a first coupling having an interior fiber-receiving receptacle and an exterior fiber-receiving receptacle, said first coupling mounted to said enclosure within said opening such that said exterior fiber-receiving receptacle of said first coupling is oriented about an exterior of said enclosure, said interior fiber-receiving receptacle of said first coupling adapted to engage said coupling end of said first fiber member, said exterior fiber-receiving receptacle of said first coupling adapted to engage a third fiber member such that said first fiber member optically communicates with the third fiber member;

a second coupling having a interior fiber-receiving receptacle and an exterior fiber-receiving receptacle, said second coupling mounted to said enclosure within said opening such that said exterior fiber-receiving receptacle of said second coupling is oriented about said exterior of said enclosure, said interior fiber-receiving receptacle of said second coupling adapted to engage said coupling end of said ribbon fiber, said exterior fiber-receiving receptacle of said second coupling adapted to engage a fourth fiber member such that said ribbon fiber optically communicates with the fourth fiber member, and;

a ribbon clamp mounted within said cavity between the optical integrated circuit and another of said side walls, said ribbon clamp having a ribbon-receiving slot formed therethrough, said ribbon-receiving slot being adapted to receive said ribbon fiber and being arranged such that said ribbon fiber extends from the optical integrated circuit through said ribbon-receiving slot toward said another of said side walls and then is directed to said interior fiber-receiving receptacle of said second coupling.

* * * * *